US009803666B2

(12) United States Patent
Whalen et al.

(10) Patent No.: US 9,803,666 B2
(45) Date of Patent: Oct. 31, 2017

(54) PIEZOELECTRIC ACTUATORS OPTIMIZED FOR SYNTHETIC JET ACTUATORS

(71) Applicant: The Boeing Company, Chicago, IL (US)

(72) Inventors: Edward A. Whalen, Webster Groves, MO (US); Steven F. Griffin, Kihei, HI (US); Marthinus Cornelius van Schoor, Arlington, MA (US); Conor Clery, Marblehead, MA (US)

(73) Assignee: The Boeing Company, Chicago, IL (US)

( * ) Notice: Subject to any disclaimer, the term of this patent is extended or adjusted under 35 U.S.C. 154(b) by 200 days.

(21) Appl. No.: 14/712,510

(22) Filed: May 14, 2015

(65) Prior Publication Data

US 2016/0333904 A1 Nov. 17, 2016

(51) Int. Cl.

| | |
|---|---|
| ***B05B 1/08*** | (2006.01) |
| ***F15D 1/00*** | (2006.01) |
| ***H01L 41/22*** | (2013.01) |
| ***F04B 43/04*** | (2006.01) |

(52) U.S. Cl.

CPC ............ *F15D 1/008* (2013.01); *F04B 43/046* (2013.01); *H01L 41/22* (2013.01)

(58) Field of Classification Search

CPC ......... F15D 1/008; F04B 43/046; H01L 41/22
See application file for complete search history.

(56) References Cited

U.S. PATENT DOCUMENTS

| | | |
|---|---|---|
| 8,490,926 B2 | 7/2013 | Clingman et al. |
| 8,931,714 B1 | 1/2015 | Pitt et al. |
| 8,937,424 B2 | 1/2015 | Griffin et al. |

(Continued)

FOREIGN PATENT DOCUMENTS

| | | |
|---|---|---|
| EP | 2698538 A2 | 2/2014 |
| EP | 2868574 A1 | 5/2015 |

OTHER PUBLICATIONS

Search Report for related European Application No. EP16164112.1; report dated Sep. 15, 2016.

(Continued)

*Primary Examiner* — Arthur O Hall
*Assistant Examiner* — Adam J Rogers
(74) *Attorney, Agent, or Firm* — Miller, Matthias & Hull LLP

(57) ABSTRACT

A synthetic jet actuator and a method for optimizing a synthetic jet actuator to meet operating requirements and physical constraints may include estimating dimension and a resonance frequency of an air cavity of the synthetic jet actuator, and using the estimated resonance frequency to the estimate dimensions of a piezoelectric actuator of the synthetic jet actuator. Individual simulations of the air cavity and piezoelectric actuator, and a coupled simulation may be performed using the estimated dimensions, and the dimensions may be revised and simulations re-executed to match the resonance frequencies of the air chamber and the piezoelectric actuator. The method maybe yield a synthetic jet actuator having a resonance frequency of the piezoelectric actuator that is approximately equal to a quarter-wavelength resonance frequency of the air cavity.

20 Claims, 4 Drawing Sheets

(56) References Cited

U.S. PATENT DOCUMENTS

| | | | | |
|---|---|---|---|---|
| 2010/0051721 | A1* | 3/2010 | Arik | F23D 14/48 239/423 |
| 2013/0039787 | A1* | 2/2013 | Lucas | F03G 7/00 417/413.1 |
| 2013/0068427 | A1* | 3/2013 | Williams | F04B 43/04 165/121 |
| 2014/0263726 | A1* | 9/2014 | de Bock | F04F 7/00 239/102.2 |
| 2014/0348668 | A1 | 11/2014 | Griffin et al. | |
| 2015/0097467 | A1 | 4/2015 | Griffin et al. | |

OTHER PUBLICATIONS

Edward A. Whalen, et al.; Orthotropic Bimorph for Improved Performance Synthetic Jet; U.S. Appl. No. 14/329,680, filed Jul. 11, 2014; pp. 1-29.

* cited by examiner

PIEZOELECTRIC ACTUATORS OPTIMIZED FOR SYNTHETIC JET ACTUATORS

TECHNICAL FIELD

The present invention relates generally to synthetic jet actuators and, in particular, to optimizing the design of piezoelectric actuators to couple their structural dynamics with the fluid dynamics and acoustics of the synthetic jet actuators with which they are implemented.

BACKGROUND

In recent years, active flow control has been used to increase the aerodynamic efficiency of machines having air flow over a surface, in particular vehicles such as airplanes. Adverse fluid flows generated over aerodynamic surfaces can buffet and fatigue downstream structures exposed to the flows, and the flows can affect efficiency by increasing drag or resistance over the surface. In one version of active flow control, jets of air are blown into the path of the adverse fluid flows to mix with the flows and cause the air to flow more smoothly over the aerodynamic surfaces and reduce the drag and resistance over the surfaces or increase the lift force generated by the surfaces. In many cases, such active flow control can be implemented in existing vehicle designs without needing significant changes thereby directly reducing the operating cost of the vehicle or other machine.

One device for creating jets of air in active flow control is a synthetic jet actuator that forms a so called synthetic jet flow by moving air back and forth through a small opening of the device. Synthetic jet actuators typically have a housing in the shape of a hollow box or cylinder with a resonant chamber therein and an orifice or nozzle opening through one of the side or end walls. At least one wall of the synthetic jet is formed from a flexible membrane that can deflect inwardly and outwardly to alternately decrease and increase the volume in the resonant chamber and expel and draw in air through the opening. Deflection of the membrane may be caused by a piezoelectric actuator that responds to an applied electric field.

The piezoelectric actuator may include a piezoceramic plate or disk having a surface facing and rigidly attached to a corresponding surface of the membrane. The actuator may have a single piezoceramic disk attached to a surface of the membrane, or two piezoceramic disks with each disk being attached in a similar manner to one of the opposing surfaces of the membrane. In alternative arrangements, a piezoelectric strain amplification structure, such as that shown in U.S. Pat. No. 8,937,424, issued to Griffin et al. on Jan. 20, 2015, and entitled, "Strain Amplification Structure and Synthetic Jet Actuator," may be implemented to cause the membrane to deflect inwardly and outwardly.

A synthetic jet actuator works most efficiently and produces a maximum synthetic jet output when the structural dynamics of the piezoelectric actuator couple with the fluid dynamics and acoustics of the synthetic jet actuator. Early designs of synthetic jet actuators included generally spherical air cavities that were generally similar to the traditional spherical Helmholtz resonators. In these designs, the resonance frequency of the spherical air cavity could be approximated accurately using the Helmholtz resonance equation for vented spheres of air as follows:

$$f_H = \frac{v}{2\pi}\sqrt{\frac{A}{V_0 L_{eq}}} \tag{1}$$

Where $f_H$ is the Helmholtz resonance frequency, v is the speed of sound in a gas which is approximately 343 m/s (approximately 1125 ft/s) at 20° C. (68° F.) and at sea level, A is the cross-sectional area of the neck or opening, $V_O$ is the static volume of the air cavity, and $L_{eq}$ is the equivalent length of the neck with end correction according to the equation $L_{eq}=L_n+0.6d$, where $L_n$ is the actual length of the neck and d is the hydraulic diameter of the neck.

Over time, synthetic jet actuators have been developed that have varying air cavity geometries, such as cubic air cavities and cylindrical air cavities. However, current design methods continue to use the Helmholtz resonance equation for estimating the resonance frequency of the non-spherical air cavities. The Helmholtz resonance equation provides a starting point for designing modern synthetic jet actuators, but the equation is a less accurate predictor of the resonance frequencies of non-spherical air cavities than spherical air cavities. In view of this, a need exists for improved design processes for coupling the structural dynamics of the piezoelectric actuators with the fluid dynamics and acoustics of the geometries of the synthetic jet actuators in which they are implemented.

SUMMARY OF THE DISCLOSURE

In one aspect of the present disclosure, a synthetic jet actuator is disclosed. The synthetic jet actuator may have an air cavity having a cylindrical shape with a cavity diameter and a cavity height, wherein the air cavity has an air cavity quarter-wavelength resonance frequency calculated based on the cavity diameter of the air cavity, and an orifice placing an interior of the air cavity in fluid communication with an ambient atmosphere surrounding the synthetic jet actuator. The synthetic jet actuator may further include a first piezoelectric actuator forming a first circular wall of the air cavity and being actuated to alternately increase and decrease a cavity volume of the air cavity to draw air into and expel the air from the air cavity through the orifice. The first piezoelectric actuator may have a first actuator resonance frequency that is approximately equal to the air cavity quarter-wavelength resonance frequency.

In another aspect of the present disclosure, a method for optimizing a synthetic jet actuator to meet operating requirements and physical constraints on a design of the synthetic jet actuator is disclosed. The synthetic jet actuator may have an air cavity having a cylindrical shape with a cavity diameter and a cavity height, and an orifice. The synthetic jet actuator may further include a piezoelectric actuator that is actuated to alternately increase and decrease a cavity volume of the air cavity to draw air into and expel the air from the air cavity, respectively, through the orifice. The method for optimizing may include calculating a resonance frequency for the air cavity based on an estimated cavity diameter for the air cavity, performing a coupled simulation of the air cavity of the synthetic jet actuator with the piezoelectric actuator using estimated air cavity dimensions and estimated piezoelectric actuator dimensions, comparing simulation output data from the coupled simulation of the air cavity and the piezoelectric actuator to the operating requirements for the synthetic jet actuator, and adjusting at least one of the estimated air cavity dimensions and the estimated piezoelectric actuator dimensions in response to determining that the simulation output data from the coupled simulation does not meet at least one of the operating requirements for the synthetic jet actuator.

In a further aspect of the present disclosure, a method for optimizing a synthetic jet actuator is disclosed. The synthetic jet actuator may have an air cavity having a cylindrical shape with a cavity diameter and a cavity height, and an orifice. The synthetic jet actuator may further include a piezoelectric actuator that is actuated to alternately increase and decrease a cavity volume of the air cavity to draw air into and expel the air from the air cavity, respectively, through the orifice. The method for optimizing may include determining operating requirements for the synthetic jet actuator, determining physical constraints on a design of the synthetic jet actuator based on an operating environment for the synthetic jet actuator, and determining estimated synthetic jet actuator dimensions for the synthetic jet actuator based on the operating requirements and the physical constraints. The method may further include calculating a resonance frequency for the air cavity based on an estimated cavity diameter for the air cavity, calculating estimated piezoelectric actuator dimensions for the piezoelectric actuator based on the estimated synthetic jet actuator dimensions and the resonance frequency, and performing simulations of the air cavity of the synthetic jet actuator and the piezoelectric actuator using the estimated synthetic jet actuator dimensions and estimated piezoelectric actuator dimensions. Still further, the method may include comparing simulation output data from the simulations of the air cavity and the piezoelectric actuator to the operating requirements for the synthetic jet actuator, and adjusting at least one of the estimated synthetic jet actuator dimensions and the estimated piezoelectric actuator dimensions in response to determining that the simulation output data from the simulations does not meet at least one of the operating requirements for the synthetic jet actuator.

Additional aspects are defined by the claims of this patent.

DETAILED DESCRIPTION

Although the following text sets forth a detailed description of numerous different embodiments, it should be understood that the legal scope of protection is defined by the words of the claims set forth at the end of this patent. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims defining the scope of protection.

It should also be understood that, unless a term is expressly defined herein, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to herein in a manner consistent with a single meaning, that is done for sake of clarity only so as to not confuse the reader, and it is not intended that such claim term be limited, by implication or otherwise, to that single meaning.

Figure 1:
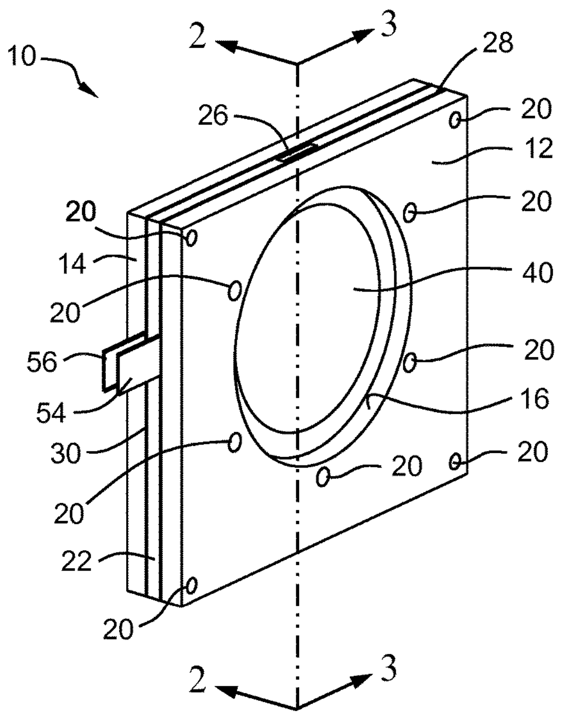
FIG. 1 is an isometric view of an exemplary pancake-type synthetic jet actuator that may be designed using a design process in accordance with the present disclosure.
Figure 2:
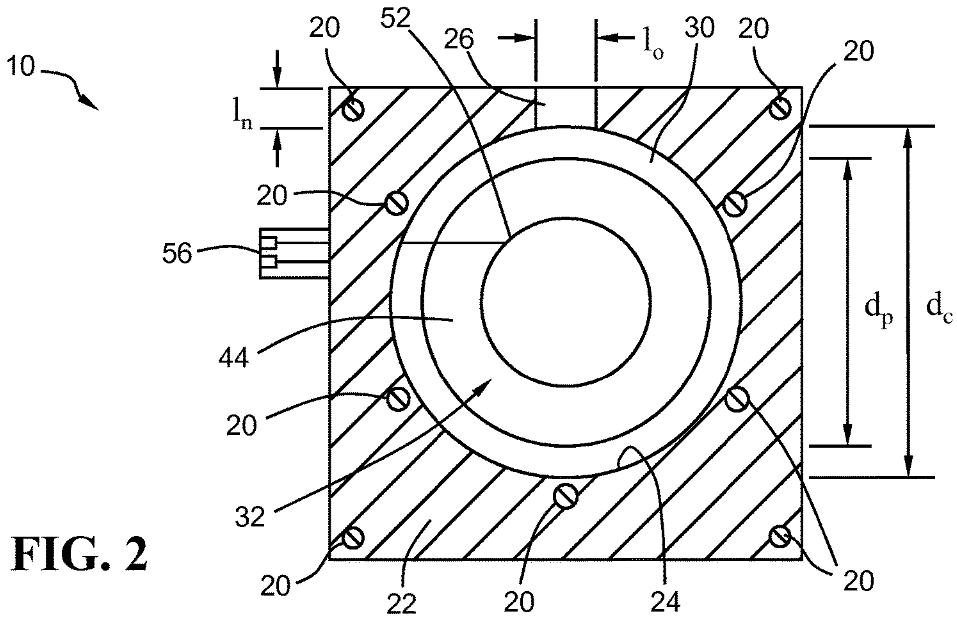
FIG. 2 is a cross-sectional view of the synthetic jet actuator of FIG. 1 taken through line 2-2.
Figure 3:
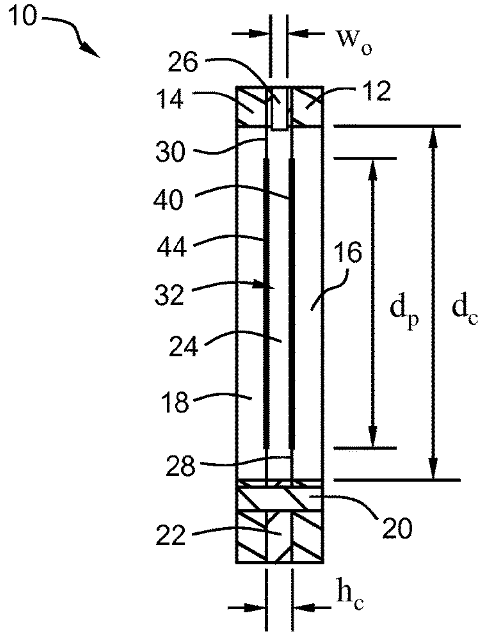
FIG. 3 is a cross-sectional view of the synthetic jet actuator of FIG. 1 taken through line 3-3.

FIGS. 1-3 illustrate one exemplary device in the form of a synthetic jet actuator 10 that may be designed utilizing methods and processes in accordance with the present disclosure. The illustrative synthetic jet actuator 10 is a cylindrical or pancake-type synthetic jet actuator having a cylindrical air chamber, as will be illustrated and discussed in greater detail hereinafter. The synthetic jet actuator 10 has an outer housing defining the air chamber therein. The outer housing includes a first clamp wall 12 and an oppositely disposed second clamp wall 14 that may be generally planar and have square or rectangular shapes. The first clamp wall 12 includes a circular first wall opening 16 there through. In the present embodiment of the synthetic jet actuator 10, the second clamp wall 14 may have a circular second wall opening 18 (FIG. 3) that aligns with the first wall opening 16 when the clamp walls 12, 14 are secured together by a plurality of fasteners 20.

The outer housing of the synthetic jet actuator 10 may further include and be completed by a planar cavity ring 22 disposed between the clamp walls 12, 14, and may have an outer periphery that matches that of the clamp walls 12, 14. A cavity ring opening 24 (FIG. 2) may extend through the cavity ring 22 and align with the wall openings 16, 18. The cavity ring 22 may further include an orifice 26 of the synthetic jet actuator 10 that extends through the cavity ring 22 from the cavity ring opening 24 to the exterior of the cavity ring 22. The orifice 26 places the air cavity of the synthetic jet in fluid communication with the ambient atmosphere surrounding the synthetic jet actuator 10, and provides a path for air to enter and exit the synthetic jet actuator 10 as described below.

Figure 4:
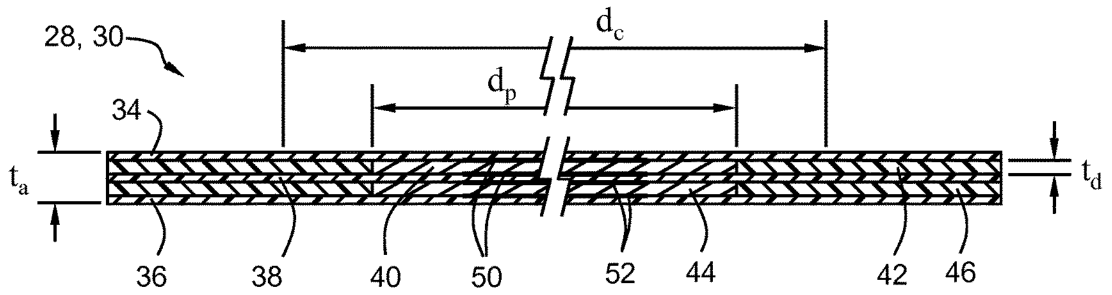
FIG. 4 is an enlarged cross-sectional view of a piezoelectric actuator of the synthetic jet actuator of FIG. 1.

The synthetic jet actuator 10 as illustrated further includes a first piezoelectric actuator 28 disposed and retained between the first clamp wall 12 and the cavity ring 22, and a second piezoelectric actuator 30 disposed and retained between the second clamp wall 14 and the cavity ring 22. In this configuration, the piezoelectric actuators 28, 30 combine with the cavity ring opening 24 to define a cylindrical air cavity 32 (FIG. 3) within the synthetic jet actuator 10. Referring to FIG. 4, the structure of the piezoelectric actuators 28, 30 is shown with the dimensions exaggerated for purposes of illustration. Each piezoelectric actuator 28, 30 may be a composite structure formed by a plurality of membrane layers alternated with layers of a piezoelectric material and polymeric spacing material. As shown, the piezoelectric actuators 28, 30 may include a first outer membrane 34, an oppositely disposed second outer membrane 36, and an inner membrane 38. A first piezoelectric disk 40 is disposed between the first outer membrane 34 and the inner membrane 38 and may be surrounded by a first spacing material layer 42. Similarly, a second piezoelectric disk 44 may be disposed between the second outer membrane 36 and the inner membrane 38 and be surrounded by a second spacing material layer 46. The piezoelectric disks 40, 44 may have a piezoelectric disk thickness $t_d$, and the piezoelectric actuators 28, 30 may have an overall piezoelectric actuator thickness $t_a$ that maybe varied to produce desired structural dynamics in the piezoelectric actuators 28, 30. The membranes 34, 36, 38 may be formed from flexible materials such as brass, copper, Kapton® or any other appropriate material to allow the piezoelectric actuators 28, 30 to deflect when the voltage is applied to the piezoelectric disks 40, 44. The spacing material layers 42, 46 may also be formed from an appropriate flexible material such as a thermoplastic polymer (e.g., polysulfone) that is sufficiently flexible and can insulate the piezoelectric disks 40, 44.

Referring back to FIG. 1, the first piezoelectric actuator 28 may include a first electrical connector 54 and the second piezoelectric actuator 30 may include a second electrical connector 56 that extend beyond the exterior of the synthetic jet actuator 10 to provide connections for external voltage sources (not shown) that will apply voltages to the electrodes 50, 52 to cause the piezoelectric actuators 28, 30 to oscillate. Within the spacing material layers 42, 46, the piezoelectric disks 40, 44 may be positioned at locations so that the piezoelectric disks 40, 44 are centered within the openings 16, 18, 24 of the clamp walls 12, 14 and the cavity ring 22.

Referring to the cross-sectional view of FIG. 2 in combination with FIG. 1, the piezoelectric disks 40, 44 may be approximately concentrically aligned with the openings 16, 18, 24. The cavity ring opening 24 defines the outer extent of the air cavity 32, and may have a cavity diameter $d_c$. The membranes 34, 36, 38 of the piezoelectric actuators 28, 30 are dimensioned to completely cover the cavity ring opening 24 and function as circular walls of the air cavity 32. Consequently, the membranes 34, 36, 38 may have dimensions that are greater than the cavity diameter $d_p$. If the membranes 34, 38, 38 are circular, they may have a membrane diameter $d_m$ that is greater than the cavity diameter $d_p$, and if the membranes 34, 38, 38 are square or rectangular, they may have membrane lengths and widths that are greater than the cavity diameter $d_p$. The piezoelectric disks 40, 44 may have a piezoelectric disk diameter $d_p$, that is less than the cavity diameter $d_c$, so that movement of the piezoelectric disks 40, 44 is not unduly constricted by the clamp walls 12, 14 and the cavity ring 22. The orifice 26 is defined within the cavity ring 22 and may have an orifice length $l_o$ across the opening and an orifice neck length $l_n$ from the edge of the cavity ring opening 24 and the air cavity 32 to the exterior of the cavity ring 22. As shown in FIG. 3, the cavity ring 22 may be dimensioned to separate the piezoelectric actuators 28, 30 so the air cavity 32 has a cavity height $h_c$ and a cavity volume $V_c$ equal to $\pi d_c^2 h_c/4$. The cavity height $h_c$ provides sufficient space for the piezoelectric actuators 28, 30 to vibrate in and out when voltage is applied to the piezoelectric disks 40, 44.

During operation, voltage is applied via the electrodes 50, 52 to cause the piezoelectric disks 40, 44 to flex and move the piezoelectric actuators 28, 30 away from each other. The cavity volume V increases and the drop in pressure in the air cavity 32 causes air to be drawn into the air cavity 32 through the orifice 26. The voltage carried by the electrodes 50, 52 is then reversed to cause the piezoelectric disk to deflect in the opposite direction and move the piezoelectric actuators 28, 30 toward each other to reduce the cavity volume V and force air out of the air cavity 32 through the orifice 26 to create a synthetic jet blast. The voltage applied by the electrodes 50, 52 to the piezoelectric actuators 28, 30 is alternated at frequencies in the range of 200-2000 Hz to rapidly create a series of synthetic jet blasts.

Those skilled in the art will understand that synthetic jet actuator 10 illustrated herein is exemplary of pancake-type synthetic jet configurations that may be designed using the methods and processes described herein, and that other configurations are known in the art and may be similarly designed. For example, varying shapes and sizes of the clamp walls 12, 14 and the cavity ring 22 may be implemented as long as the air cavity 32 has the cylindrical shape described above, and with ample space external to the air cavity 32 for the piezoelectric actuators 28, 30 to deflect in and out without physical restriction or air pressure restrictions. Further alternative embodiments may incorporate only one piezoelectric actuator 28, 30 of the type described herein, with the other piezoelectric actuator 28, 30 being replaced by a solid wall defining the air cavity 32. For example, second piezoelectric actuator 30 may be omitted and the second clamp wall 14 may be solid and not provide the opening 18. Alternatively, the second clamp all 14 without the opening may be combined with the cavity ring 22 is a single unitary component connected to the first clamp wall 12 and with the cavity ring opening 24 being a cylindrical recess extending partially inwardly from the planar surface of the combined component and intersecting the orifice 26. In still further alternative pancake-type synthetic jets, alternative piezoelectric actuator arrangements, such as that shown in the Griffin et al. patent discussed above and expressly incorporated by reference herein, may be used in place of the piezoelectric actuators 28, 30. In such synthetic jet actuators, each of the piezoelectric actuators 28, 30 may be replaced by a flexible membrane or diaphragm that is oscillated by an amplification structure frame of the type disclosed in the Griffin et al. patent to create the desired jet blasts.

In synthetic jet actuators 10 as described herein, performance is optimized when the resonance frequency of the piezoelectric actuator 28, 30 matches or is coupled to the resonance frequency of the air cavity 32 of the synthetic jet actuator 10. When the frequencies are coupled, the synthetic jet actuator 10 may perform at optimal efficiency such that a maximum synthetic jet output is generated when a maximum available power is applied, or a required output air blast is produced using a minimum amount of input power from the voltage source. In previous design strategies, initial estimates of the resonance frequencies of pancake-type synthetic jet actuators 10 are relatively inaccurate due to the use of the Helmholtz resonance frequency of Eq. (1). Design processes in accordance with the present disclosure provide more accurate initial resonance frequency estimates and correspondingly may reduce the overall design time to get from requirements to prototype testing.

Figure 5A:
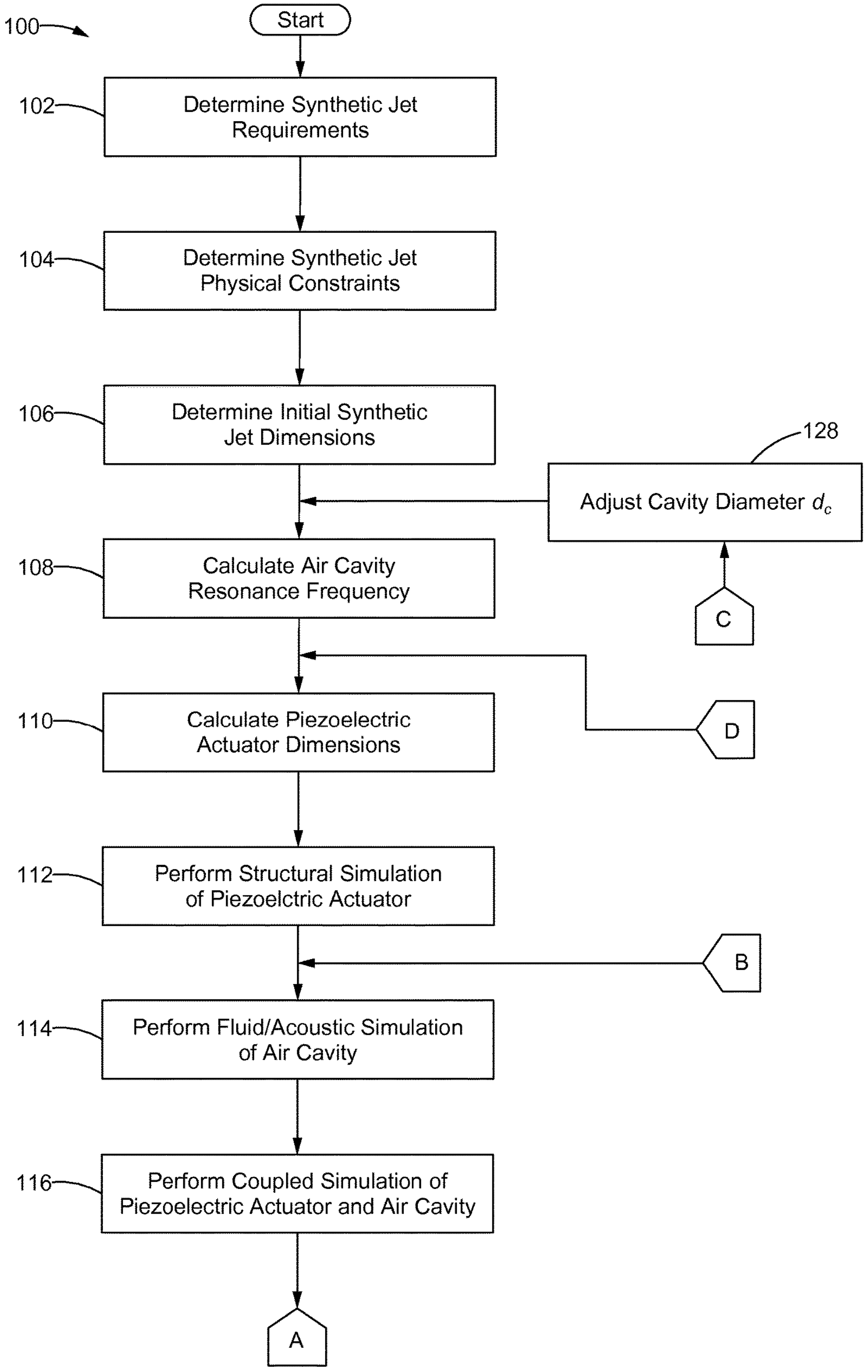
FIGS. 5A and 5B are an exemplary synthetic jet actuator design routine in accordance with the present disclosure.
Figure 5B:
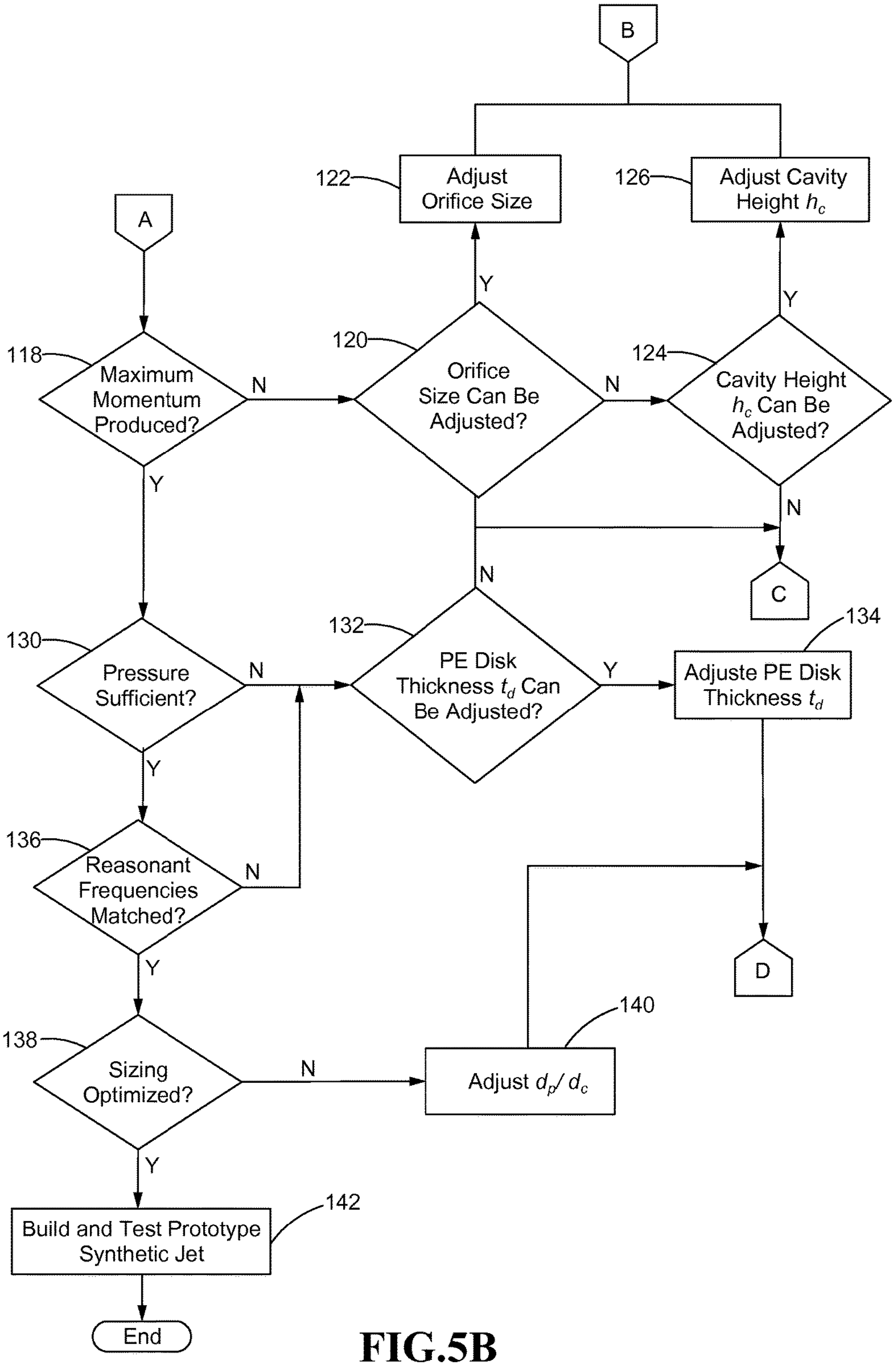

FIGS. 5A and 5B illustrate an embodiment of a synthetic jet actuator design routine 100 in accordance with the present disclosure that may be used to design a pancake-type a synthetic jet actuator such as the synthetic jet actuator 10 illustrated and described herein. The design routine 100 may begin at a block 102 where the operating requirements for the synthetic jet actuator 10 are set. The operating requirements may include the momentum required of the synthetic jet output by the synthetic jet actuator 10, the velocity of the synthetic jet and the orifice size required to cause the desired airflow pattern over a surface. Once the operating requirements are established at the block 102, control may pass to a block 104 to determine the physical constraints on implementing the synthetic jet actuator 10. For example, in aeronautical applications, the synthetic jet actuator 10 may be installed within an airfoil such as a wing or vertical fin of an airplane. The space available for the synthetic jet actuator 10 may be limited by the size and support structure of the airfoil and other components contained therein. Additionally, in such applications, the total weight is a concern and may further limit the size and/or materials from which the synthetic jet actuator 10 is fabricated. All the constraints on the design must be known before the configuration of the synthetic jet actuator 10 can be determined.

After the operating requirements are established at the block 102 and the design constraints are identified at the block 104, control may pass to a block 106 for an initial calculation of the dimensions of the air cavity 32. As discussed above, the relevant dimensions for the air cavity 32 include the cavity diameter $d_c$ and the cavity height $h_c$. The cavity diameter $d_c$ may be selected for the synthetic jet actuator 10 to fit within the constraints identified at the block 104. The synthetic jet actuator 10 must allow for the full range of displacement of the piezoelectric actuators 28, 30 to ensure proper functioning of the synthetic jet actuator 10. Consequently, the cavity height $h_c$ must provide sufficient space between for the piezoelectric actuators 28, 30 to displace toward each other without coming into contact. A cavity height $h_c$ equal to approximately three times the maximum inward displacement of the piezoelectric actuators 28, 30 may be sufficient to prevent contact. In most implementations, the desired cavity height $h_c$ equates to approximately 0.2% of the cavity diameter $d_c$ and may be set accordingly.

Initial estimates of the orifice length $l_o$ and the orifice neck length $l_n$ may be calculated based on the cavity diameter $d_c$. The orifice length $l_o$ may be set at a length within the range of 30%-40% of the cavity diameter $d_c$, and in one embodiment may be set equal to $\frac{1}{3}^{rd}$ of the cavity diameter $d_c$. The orifice neck length $l_n$ may be set at a length within the range of 10%-20% of the cavity diameter $d_c$, and in one embodiment may be set equal to 15% of the cavity diameter $d_c$. The applicants have determined that these ratios in relation to the estimated cavity diameter $d_c$ provide close approximations of the actual orifice length $l_o$ and orifice neck length $l_n$ necessary to meet the design requirements of the synthetic jet actuator 10.

After the initial dimensions of the air cavity 32 and the orifice 26 of the synthetic jet actuator 10 are determined at the block 106, control may pass to a block 108 to estimate the acoustic or resonance frequency of the air cavity 32 based on the initial dimensions. As discussed above, in previous design processes, the resonance frequency of a given synthetic jet design was estimated using Helmholtz resonance equation for spherical resonators set forth above in Eq. (1) regardless of the geometry of the air cavity. In contrast, the synthetic jet actuator design routine 100 in accordance with the present disclosure estimates the resonance frequency for the pancake-type synthetic jet actuator 10 using the resonance frequency equation as follows:

$$f_c = v/4d_c \tag{2}$$

Eq. (2) yields the quarter-wave resonance frequency $f_c$ for a tube that is closed at one end having a length equal to the cavity diameter $d_c$. Additional harmonics of the quarter-wave resonance frequency $f_c$ are found by multiplying the quarter-wave resonance frequency $f_c$ of Eq. (2) by odd numbers. Though the quarter-wave resonance frequency $f_c$ of Eq. (2) is applied to a different geometry than the air cavity 32 of the pancake-type synthetic jet actuator 10, Eq. (2) yields a much closer initial approximation of the actual resonance frequency of the air cavity 32 of the synthetic jet actuator 10 than the Helmholtz resonance frequency $f_H$ of Eq. (1), and consequently will reduce the time required to arrive at the final design for the synthetic jet actuator 10.

As an alternative to Eq. (2), particularly for more complicated geometries having multiple apertures, apertures of different shapes and air cavities 32 having different shapes, the resonance frequency $f_c$ for the air cavity 32 may be predicted using a relatively coarse acoustic finite element model with maximum pressure boundaries at all points of the enclosing structure and minimum pressure boundaries at all apertures. The coarse finite element model may also provide a more accurate approximation of the resonance frequency $f_c$ for the air cavity 32 than the Helmholtz resonance frequency $f_H$ of Eq. (1). Those skilled in the art will understand that although the pancake-type synthetic jet actuator 10 is used as an example for optimizing the design of a synthetic jet actuator, the design routine 100 as detailed herein may be used to optimizing the designs of synthetic jet actuators having non-circular air cavities, such as air cavities that are elliptical, square and rectangular.

After the resonance frequency $f_c$ of the air cavity 32 is determined at the block 108 using Eq. (2), or prior to or concurrently there with, control may pass to a block 110 for a determination of the dimensions of the piezoelectric actuators 28, 30 and the components thereof. As with the orifice length $l_o$ and the orifice neck length $l_n$ of the orifice 26, some of the relevant dimensions of the piezoelectric actuators 28, 30 may be initially estimated during the design process based on the cavity diameter $d_c$. The piezoelectric disk diameter $d_p$ may be estimated to have a value within a range of 75%-90% of the cavity diameter $d_c$, and in one embodiment may be calculated as 82.5% of the cavity diameter $d_c$. The piezoelectric actuator thickness $t_a$ may be estimated to have a value within a range of 1.0%-2.5% of the cavity diameter $d_c$ to balance the blocked force and the free displacement of the disks 40, 44. In one embodiment, the piezoelectric actuator thickness $t_a$ may be calculated as 1.5% of the cavity diameter $d_c$.

With the piezoelectric disk diameter $d_p$ and piezoelectric actuator thickness $t_a$ known, the remaining dimensions and material properties of the piezoelectric actuators 28, 30 may be estimated by matching a resonance frequency $f_p$ of the piezoelectric actuators 28, 30 to the resonance frequency $f_c$ of the air cavity 32 from Eq. (2). Depending on the operating requirements for the synthetic jet actuator 10 determined at the block 102, may behave like either a circular member or a circular plate, and an appropriate equation for the resonance frequency $f_p$ may be used to estimate the remaining dimensions and material properties of the piezoelectric actuators 28, 30. Where the piezoelectric actuators 28, 30 behave like a circular membrane, the following equation for the resonance frequency $f_p$ may be used:

$$f_p = \sqrt{T/\sigma}/d_c \tag{3}$$

Where $f_p$ is a resonance frequency of the piezoelectric actuators 28, 30, T is a membrane tension of the piezoelectric actuators 28, 30, and σ is a density of the piezoelectric actuators 28, 30. The thickness and the materials of the membranes 34, 36, 37, the piezoelectric disks 40, 44, and the spacing material layers 42, 46, and the tension in the membranes 34, 36, 38 when the piezoelectric actuators 28, 30 are installed in the synthetic jet actuator 10 may be selected so that the resonance frequency $f_p$ of the piezoelectric actuators 28, 30 calculated using Eq. (3) matches the resonance frequency $f_p$ of the air cavity 32 calculated using Eq. (2).

Where the piezoelectric actuators 28, 30 behave like circular plates, the following equation for the resonance frequency $f_p$ for a circular plate that is free at the edge may be appropriate:

$$f_p = 6.09\sqrt{Et_a^3/\rho d_c^4(1-v^2)} \tag{4}$$

Where E is Young's modulus, ρ is the mass density, and ν is Poisson's ratio, each based on the materials used in the piezoelectric actuators 28, 30. The piezoelectric actuator thickness $t_a$ and the cavity diameter $d_c$, were determined earlier in the routine 100. As with the Eq. (3) when the piezoelectric actuators 28, 30 behave like circular membranes, the thickness and the materials of the membranes 34, 36, 37, the piezoelectric disks 40, 44, and the spacing material layers 42, 46 may be selected so that the resonance frequency $f_p$ of the piezoelectric actuators 28, 30 behaving like circular plates calculated using Eq. (4) matches the resonance frequency $f_c$ of the air cavity 32 calculated using Eq. (2).

With the dimensions and the resonance frequency $f_p$ of the piezoelectric actuators 28, 30 and the air cavity 32 of the synthetic jet actuator 10 determined at the blocks 106-110, the preliminary design of the synthetic jet actuator 10 may be analyzed and refined before incurring the cost of building and testing a prototype. In the illustrated embodiment of the design routine 100, separate simulations may be run on the designs for the piezoelectric actuators 28, 30 and the air cavity 32, and then the simulations may be combined to determine whether their performance together meets the operating requirements for the synthetic jet actuator 10 identified at the block 102 in an optimal manner. Consequently, control may pass from the block 110 to a block 112 where a structural simulation of the design of the piezoelectric actuators 28, 30 may be performed to determine the structural resonance frequency of piezoelectric actuators 28, 30 having the calculated dimensions. The simulation may be performed using any appropriate simulation method known in the art such as, for example, commercially available finite element analysis software such as NASTRAN, ANSYS and the like, custom developed modeling software of other appropriate modeling strategy. The simulation of the piezoelectric actuators 28, 30 will yield a structural resonance frequency $f_{ps}$ for the actuators 28, 30 when isolated from the air cavity 32 that may be equal to or differ from the resonance frequency $f_p$ of the cylindrical membrane under tension calculated using Eq. (3).

Prior to, concurrently with or after the structural simulation is performed for the piezoelectric actuators 28, 30 at the block 112, control may pass to a block 114 wherein a fluid and acoustic simulation may be performed on the air cavity 32 to determine an acoustic resonance frequency $f_{ca}$ of the air cavity 32 with the previously calculated dimensions. Similar to the simulation of the piezoelectric actuators 28, 30, the simulation of the air cavity 32 may be performed using an appropriate simulation method known in the art such as, for example, those described above. As with the resonance frequencies $f_p$ and $f_{ps}$, the acoustic resonance frequency $f_{ca}$ from the simulation may be the same or different than the resonance frequency $f_c$ from Eq. (2).

After the simulations are performed for the piezoelectric actuators 28, 30 and the air cavity 32 at the blocks 112, 114, respectively, control may pass to a block 116 for performance of a coupled simulation of the synthetic jet actuator 10, modal interaction modeling, or other appropriate modeling strategy using the designs of the piezoelectric actuators 28, 30 and the air cavity 32. The coupled simulation may be performed using similar methods as discussed for the individual simulations, but includes the particular design characteristics for both the piezoelectric actuators 28, 30 and the air cavity 32. The coupled simulation may provide results indicative of whether the resonance frequencies of the piezoelectric actuators 28, 30 and the air cavity 32 are sufficiently matched when both are integrated into the synthetic jet actuator 10, and whether the synthetic jet actuator 10 will generate the magnitude of pressure required to meet the synthetic jet momentum requirement identified at the block 102.

After the coupled simulation is performed, the results may be evaluated to determine whether the design of the synthetic jet actuator 10 and its components should be refined to meet the requirements for the synthetic jet actuator 10 or to optimize the design of the synthetic jet actuator 10 if the requirements are met. To begin the evaluation, control may pass from the block 116 to a block 118 where the coupled simulation results are evaluated to determine whether the synthetic jet actuator 10 will produce the required maximum momentum for air output by the synthetic jet actuator 10. If the synthetic jet actuator 10 will not produce the required maximum momentum, control may pass to a block 120 to determine whether the design requirements and design constraints will allow the dimensions of the orifice 26 to be adjusted to attempt to produce a design for the synthetic jet actuator 10 that will produce the required maximum momentum. Limitations on adjusting the dimensions of the orifice 26 may include practical limits on reducing or enlarging the orifice 26 based on fluid flow characteristics of air, physical limits on changing the dimensions of the orifice 26 based on the physical constraints on the synthetic jet actuator 10 identified at the block 104, such as space limitations that preclude increasing the orifice neck length $l_n$, and the like. The ability to adjust the dimensions may also be controlled or influenced by scaling with regard to a flow field being controlled, such as by a ratio relative to a boundary layer thickness that may be suggestive of an optimal size of the orifice 26. If the size of the orifice 26 can be adjusted in the manner required to increase the maximum momentum for air output by the synthetic jet actuator 10, control may pass to a block 122 where the necessary adjustment to the size of the orifice 26 is performed, after which control may pass back to the block 114 to perform the isolated fluid and acoustic simulation of the air cavity 32 with the revised dimensions of the orifice 26 prior to re-executing the coupled simulation at the block 116.

If the design of the synthetic jet actuator 10 does not produce the required maximum momentum at the block 118 and the dimensions of the orifice 26 cannot be adjusted at the block 120, control may pass to block 124 to determine whether the cavity height $h_c$ can be adjusted in a manner that will increase the maximum momentum of the synthetic jet actuator 10. As with adjustment of the dimensions of the orifice 26, the design requirements and design constraints may be evaluated to determine whether the cavity height $h_c$ can be adjusted to increase the momentum of air output by the synthetic jet actuator 10. If the cavity height $h_c$ can be adjusted, control may pass to a block 126 where the cavity height $h_c$ is adjusted in a manner that is anticipated to increase the momentum of air output by the synthetic jet actuator 10, and then back to the block 114 to perform the isolated fluid and acoustic simulation of the air cavity 32 with the revised cavity height $h_c$.

If neither the orifice 26 nor the cavity height $h_c$ can be adjusted at the blocks 120, 124, the remaining alternative for increasing the maximum momentum of air output by the synthetic jet actuator 10 may be to adjust the cavity diameter $d_c$, which may have a larger impact on the design and simulations based the dependence of other parameters on the cavity diameter $d_c$ and the corresponding resonance frequency $f_c$ of the air cavity 32. Consequently, when the orifice 26 and the cavity height $h_c$ cannot be adjusted, control may pass to a block 128 where the cavity diameter $d_c$ may be adjusted within the limits established by the physical constraints of the synthetic jet actuator 10. With the change to the cavity diameter $d_c$, the other dimensions of the resonance frequency $f_c$ will change, as will dimensions and the resonance frequency $f_p$ of the piezoelectric actuators 28, 30 that are based on the cavity diameter $d_c$, and the resonance frequency $f_c$ of the air cavity 32. For this reason, after the cavity diameter $d_c$ is adjusted at the block 128, control may pass back to the block 108 for recalculation of the resonance frequency $f_c$ based on the new cavity diameter $d_c$, and then to the block 110 to recalculate the piezoelectric actuator 28, 30 dimensions and the resonance frequency $f_p$ before re-executing the simulations at the blocks 112, 114, 116.

Returning to the block 118, if the maximum momentum produced by the synthetic jet actuator 10 in the simulations meets the requirements, control may pass to a block 130 to determine whether the design of the synthetic jet actuator 10 will create sufficient air pressure to meet the design requirements. If the design will not create sufficient pressure, control may pass to a block 132 to determine whether the piezoelectric disk thickness $t_d$ can be adjusted to produce the necessary pressure. Depending on the present design conditions and the factors limiting the performance of the piezoelectric actuators 28, 30, the piezoelectric disk thickness $t_d$ can be increased to increase the blocked force created by the piezoelectric actuators 28, 30, or decreased to increase the displacement of the piezoelectric actuators 28, 30. If the piezoelectric disk thickness $t_d$ cannot be adjusted as necessary to product the required pressure, such as where the cavity height $h_c$ may be insufficient to accommodate increased displacement of the piezoelectric actuators 28, 30, control may pass to the block 128 to adjust the cavity diameter $d_c$ as necessary before recalculating the piezoelectric actuator 28, 30 dimensions and the resonance frequency $f_p$ at the block 110 and re-executing the simulations at the blocks 112, 114, 116. If it is determined at the block 132 that the piezoelectric disk thickness $t_d$ can be adjusted, control may pass to a block 134 where the necessary adjustment to the piezoelectric disk thickness $t_d$ is performed before control may be passed back to the block 110 to recalculate the other dimensions and the resonance frequency $f_p$ of the piezoelectric actuators 28, 30 and then to the block 112 to perform the structural simulation of the piezoelectric actuators 28, 30 with the revised piezoelectric actuators 28, 30.

If the pressure created by the synthetic jet actuator 10 is determined to be sufficient at the block 130, control may pass to a block 136 to evaluate whether the resonance frequency $f_{ps}$ of the piezoelectric actuators 28, 30 and the resonance frequency $f_{ca}$ of the air cavity 32 from the simulations match. If the resonance frequencies $f_{ps}$,$f_{ca}$ do not match at the block 136, control may pass to the block 132 to determine whether piezoelectric disk thickness $t_d$ can be adjusted or the cavity diameter $d_c$ must be adjusted before re-executing the simulations in an effort to match the resonance frequencies $f_{ps}$,$f_{ca}$. If the resonance frequencies $f_{ps}$,$f_{ca}$ are matched at the block 136 in addition to the design of the synthetic jet actuator 10 producing the required maximum momentum and sufficient pressure, control may pass to a block 138 to determine whether the sizing of the synthetic jet actuator 10 is optimized. Optimization of the synthetic jet actuator 10 may be a system level determination that may be dictated by a flow field that the synthetic jet actuator 10 must produce. There are potentially many different sized designs that can achieve the requirements determined at the block 102. The optimization determination may be made based on whether the synthetic jet actuator 10 fits in the required area, is the most electrically efficient solution and the like.

If the design satisfies the requirements for the synthetic jet actuator 10 but may not be optimized, control may pass to a block 140 where the ratio of the piezoelectric disk diameter $d_p$ to the cavity diameter $d_c$, may be adjusted. As discussed above, the piezoelectric disk diameter $d_p$ may initially be set equal to approximately 82.5% of the cavity diameter $d_c$. At the block 140, the piezoelectric disk diameter $d_p$ may be increased or decreased by a small increment that a designer in their experience may believe may fine-tune the resonance frequency coupling of the components of the synthetic jet actuator 10, but with the piezoelectric disk diameter $d_p$ still approximately equal to 82.5% of the cavity diameter $d_c$. After the piezoelectric disk diameter $d_p$ is adjusted, control may pass back to the block 110 to recalculate the other dimensions and the resonance frequency $f_p$ of the piezoelectric actuators 28, 30 and then to the block 112 to re-perform the simulations and reevaluate the design. If the design is determined to be optimized at the block 138, control may pass to a block 142 where the designer may proceed with building and testing a prototype of the synthetic jet actuator 10 to confirm that the actual device will perform within the operating requirements. If the prototype synthetic jet actuator 10 does not perform as required, the designer may reenter the design routine 100 at any appropriate location to modify the design, perform the simulations and compare the results to the design requirements for the synthetic jet actuator 10.

INDUSTRIAL APPLICABILITY

The design routine 100 in accordance with the present disclosure may reduce the time required to get from a requirements definition and initial configuration of a synthetic jet actuator 10 to an optimized design that can be converted into a prototype for physical testing. The design routine 100 recognizes and acknowledges the role of mechanical acoustic coupling to optimize the synthetic jet actuator 10 to take advantage of the coupling of the quarter-wavelength resonance frequency or coarse finite element model over coupling in the Helmholtz domain and provide synthetic jet actuator performance beyond that obtained through previous design processes relying on the Helmholtz resonance frequencies. In the optimized design, the resonance frequency of the piezoelectric actuators 28, 30 maybe approximately equal to the quarter-wavelength resonance frequency of the air chamber, and may be within ±10% of the quarter-wavelength resonance frequency. The difference may be attributable to the air cavity 32 not having the geometry assumed for Eq. (2) of a closed ended tube, but the quarter-wavelength resonance frequency captures the relationship between the scale and the frequency far more accurately than the Helmholtz frequency of Eq. (1) used in previous design processed. Improved design processes are further achieved by sizing the piezoelectric actuators 28, 30 relative to the size of the air cavity 32 of the synthetic jet actuator 10 and selecting the thickness of the piezoelectric disks appropriately so that the efficiency of the synthetic jet actuator 10 is maximized to achieve an optimal synthetic jet momentum for the electrical power input to the piezoelectric actuators 28, 30. This design methodology may bring the performance of the synthetic jet actuator 10 into a range that could be effective on full-scale aerospace platforms.

While the preceding text sets forth a detailed description of numerous different embodiments, it should be understood that the legal scope of protection is defined by the words of the claims set forth at the end of this patent. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims defining the scope of protection.

What is claimed is:

1. A method for optimizing a synthetic jet actuator to meet operating requirements and physical constraints on a design of the synthetic jet actuator, the synthetic jet actuator having an air cavity having a cylindrical shape with a cavity diameter and a cavity height, and an orifice, the synthetic jet actuator further including a piezoelectric actuator that is actuated to alternately increase and decrease a cavity volume of the air cavity to draw air into and expel the air from the air cavity, respectively, through the orifice, the method for optimizing comprising:

calculating a resonance frequency for the air cavity based on an estimated cavity diameter for the air cavity;

performing a coupled simulation of the air cavity of the synthetic jet actuator with the piezoelectric actuator using estimated air cavity dimensions and estimated piezoelectric actuator dimensions;

comparing simulation output data from the coupled simulation of the air cavity and the piezoelectric actuator to the operating requirements for the synthetic jet actuator; and adjusting at least one of the estimated air cavity dimensions and the estimated piezoelectric actuator dimensions in response to determining that the simulation output data from the coupled simulation does not meet at least one of the operating requirements for the synthetic jet actuator.

2. The method for optimizing a synthetic jet actuator of claim 1, wherein calculating the resonance frequency for the air cavity comprises solving a quarter-wavelength resonance frequency equation:

$$f_c = v/4d_c$$

where $f_c$ is a quarter-wavelength resonance frequency for a tube that is closed at one end, v is a speed of sound in a gas, and $d_c$ is the estimated cavity diameter for the air cavity.

3. The method for optimizing a synthetic jet actuator of claim 1, wherein calculating the resonance frequency for the air cavity comprises creating a coarse finite element model of the air cavity with maximum pressure conditions at all structural boundaries and minimum pressure conditions at all orifices.

4. The method for optimizing a synthetic jet actuator of claim 1, comprising performing a structural simulation of the piezoelectric actuator using the estimated piezoelectric actuator dimensions and performing a fluid and acoustic simulation of the air cavity of the synthetic jet actuator using the estimated air cavity dimensions before performing the coupled simulation of the air cavity of the synthetic jet actuator with the piezoelectric actuator.

5. The method for optimizing a synthetic jet actuator of claim 1, wherein comparing the simulation output data from the coupled simulation to the operating requirements for the synthetic jet actuator comprises comparing a simulation maximum output momentum of air output through the orifice from the coupled simulation is at least equal to a required maximum output momentum of the operating requirements;

wherein adjusting at least one of the estimated air cavity dimensions and the estimated piezoelectric actuator dimensions comprises adjusting at least one of an orifice length, an orifice width and an orifice neck length of the orifice to increase the simulation maximum output momentum in response to determining that the simulation maximum output momentum is less than the required maximum output momentum; and wherein the method for optimizing comprises re-performing the coupled simulation of the air cavity of the synthetic jet actuator with the piezoelectric actuator after adjusting at least one of the orifice length, the orifice width and the orifice neck length.

6. The method for optimizing a synthetic jet actuator of claim 5, comprising:

determining whether at least one of the orifice length, the orifice width and the orifice neck length may be adjusted to increase the simulation maximum output momentum, wherein adjusting at least one of the estimated air cavity dimensions and the estimated piezoelectric actuator dimensions comprises adjusting the cavity diameter of the air cavity to increase the simulation maximum output momentum in response to determining that the orifice length, the orifice width and the orifice neck length may not be adjusted to increase the simulation maximum output momentum; and recalculation the resonance frequency after adjusting the cavity diameter of the air cavity in response to determining that the orifice length, the orifice width and the orifice neck length may not be adjusted to increase the simulation maximum output momentum.

7. The method for optimizing a synthetic jet actuator of claim 1, wherein adjusting at least one of the estimated air cavity dimensions and the estimated piezoelectric actuator dimensions comprises adjusting a piezoelectric disk thickness of the piezoelectric actuator in response to determining that a simulation synthetic jet actuator output pressure is less than a required synthetic jet actuator output pressure or that a piezoelectric actuator resonance frequency is not equal to the resonance frequency for the air cavity; and wherein the method for optimizing comprises recalculating the estimated piezoelectric actuator dimensions and re-performing the coupled simulation of the air cavity of the synthetic jet actuator with the piezoelectric actuator after adjusting the piezoelectric disk thickness.

8. The method for optimizing a synthetic jet actuator of claim 1, comprising setting a piezoelectric disk diameter of a piezoelectric disk of the piezoelectric actuator equal to a value within a range of 75% to 90% of the cavity diameter of the air cavity.

9. A method for optimizing a synthetic jet actuator having an air cavity having a cylindrical shape with a cavity diameter and a cavity height, and an orifice, the synthetic jet actuator further including a piezoelectric actuator that is actuated to alternately increase and decrease a cavity volume of the air cavity to draw air into and expel the air from the air cavity, respectively, through the orifice, the method for optimizing comprising:

determining operating requirements for the synthetic jet actuator;

determining physical constraints on a design of the synthetic jet actuator based on an operating environment for the synthetic jet actuator;

determining estimated synthetic jet actuator dimensions for the synthetic jet actuator based on the operating requirements and the physical constraints;

calculating a resonance frequency for the air cavity based on an estimated cavity diameter for the air cavity;

calculating estimated piezoelectric actuator dimensions for the piezoelectric actuator based on the estimated synthetic jet actuator dimensions and the resonance frequency;

performing simulations of the air cavity of the synthetic jet actuator and the piezoelectric actuator using the estimated synthetic jet actuator dimensions and estimated piezoelectric actuator dimensions;

comparing simulation output data from the simulations of the air cavity and the piezoelectric actuator to the operating requirements for the synthetic jet actuator; and adjusting at least one of the estimated synthetic jet actuator dimensions and the estimated piezoelectric actuator dimensions in response to determining that the simulation output data from the simulations does not meet at least one of the operating requirements for the synthetic jet actuator.

10. The method for optimizing a synthetic jet actuator of claim 9, wherein calculating the resonance frequency for the air cavity comprises solving a quarter-wavelength resonance frequency equation:

$$f_c = v/4d_c$$

where $f_c$ is a quarter-wavelength resonance frequency for a tube that is closed at one end, v is a speed of sound in a gas, and $d_c$ is the estimated cavity diameter for the air cavity.

11. The method for optimizing a synthetic jet actuator of claim 9, wherein determining the estimated synthetic jet actuator dimensions for the synthetic jet actuator comprises setting an estimated cavity height equal to a value within a range of 0.15% to 0.25% of the estimated cavity diameter.

12. The method for optimizing a synthetic jet actuator of claim 9, wherein determining the estimated piezoelectric actuator dimensions for the piezoelectric actuator comprises setting an estimated piezoelectric disk diameter equal to a value within a range of 75%-90% of the estimated cavity diameter.

13. The method for optimizing a synthetic jet actuator of claim 9, wherein determining the estimated piezoelectric actuator dimensions for the piezoelectric actuator comprises setting an estimated piezoelectric disk diameter equal to approximately 82.5% of the estimated cavity diameter.

14. The method for optimizing a synthetic jet actuator of claim 9, wherein determining the estimated piezoelectric actuator dimensions for the piezoelectric actuator comprises setting an estimated piezoelectric actuator thickness equal to a value within a range of 1.0%-2.5% of the estimated cavity diameter.

15. The method for optimizing a synthetic jet actuator of claim 9, wherein performing the simulations of the air cavity of the synthetic jet actuator and the piezoelectric actuator comprises:

performing a structural simulation of the piezoelectric actuator using the estimated piezoelectric actuator dimensions;

performing a fluid and acoustic simulation of the air cavity of the synthetic jet actuator using the estimated synthetic jet actuator dimensions; and performing a coupled simulation of the air cavity of the synthetic jet actuator with the piezoelectric actuator using estimated air cavity dimensions and the estimated piezoelectric actuator dimensions.

16. A method for optimizing an aerodynamic efficiency of an aircraft having airflow over an aerodynamic surface of the aircraft using active flow control, the method comprising:

configuring a first piezoelectric actuator forming a first circular wall of an air cavity of a synthetic jet actuator to have a first actuator resonant frequency that is approximately equal to an air cavity quarter-wavelength resonant frequency of the air cavity, wherein the air cavity has a cylindrical shape with a cavity diameter and a cavity height and the synthetic jet further includes an orifice, wherein the first piezoelectric actuator is actuated to alternately increase and decrease a cavity volume of the air cavity to draw air into and expel a jet of air from the air cavity, respectively, through the orifice;

installing the synthetic jet actuator at the aerodynamic surface to blow the jet of air into the airflow over the aerodynamic surface to cause the airflow to flow more smoothly over the aerodynamic surface.

17. The method of claim 16, where the air cavity quarter-wavelength resonance frequency is calculated using equation:

$$f_c = v/4d_c$$

where $f_c$ is the air cavity quarter-wavelength resonance frequency for a tube that is closed at one end, v is a speed of sound in a gas, and $d_c$ is the cavity diameter for the air cavity.

18. The method of claim 16, comprising:

configuring a second piezoelectric actuator forming a second circular wall of the air cavity opposite the first circular wall and the first piezoelectric actuator to have a second actuator resonance frequency that is approximately equal to the air cavity quarter-wavelength resonance frequency, wherein the second piezoelectric actuator is actuated to increase the cavity volume when the first piezoelectric actuator increases the cavity volume and to decrease the cavity volume when the first piezoelectric actuator decreases the cavity volume.

19. The method of claim 16, comprising configuring the first piezoelectric actuator with a membrane having a membrane dimension that is greater than the cavity diameter, and a piezoelectric disk attached to a surface of the membrane and having a piezoelectric disk diameter that is within a range of 75%-90% of the cavity diameter, wherein the piezoelectric disk is actuated to alternately increase and decrease the cavity volume of the air cavity.

20. The method of claim 19, wherein the piezoelectric disk diameter is equal to approximately 82.5% of the cavity diameter.

* * * * *